Figure 6:
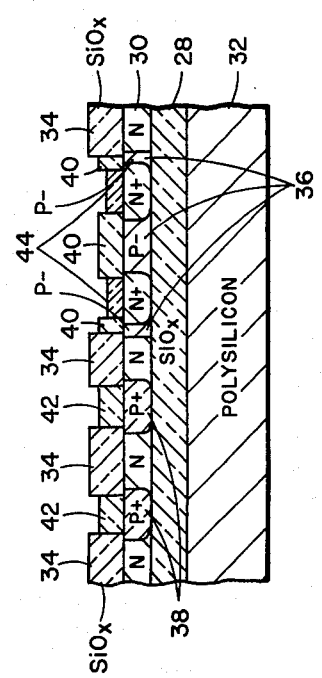

United States Patent [19]

Wang

[11] 3,964,941
[45] June 22, 1976

[54] METHOD OF MAKING ISOLATED COMPLEMENTARY MONOLITHIC INSULATED GATE FIELD EFFECT TRANSISTORS

[75] Inventor: Raymond C. Wang, Tempe, Ariz.
[73] Assignee: Motorola, Inc., Chicago, Ill.
[22] Filed: May 7, 1973
[21] Appl. No.: 358,190

Related U.S. Application Data

[63] Continuation of Ser. No. 154,922, June 21, 1971, abandoned.

[52] U.S. Cl. ............................ 148/187; 148/189; 148/175; 357/42
[51] Int. Cl.² .................... H01L 7/36; H01L 7/64
[58] Field of Search ................ 148/187, 175; 317/235 B, 235 G, 235 AT; 357/42

[56] References Cited
UNITED STATES PATENTS

| | | | |
|---|---|---|---|
| 3,390,022 | 6/1968 | Fa | 148/33 |
| 3,514,676 | 5/1970 | Fa | 317/235 G |
| 3,646,665 | 3/1972 | Kim | 148/187 X |
| 3,667,009 | 5/1972 | Rugg | 317/235 G |
| 3,755,012 | 8/1973 | George et al. | 148/175 |
| 3,783,045 | 1/1974 | Ronzi | 148/187 |

Primary Examiner—G. Ozaki
Attorney, Agent, or Firm—Willis E. Higgins; Harry M. Weiss

[57] ABSTRACT

Complementary insulated gate field effect transistors are formed in a thin semiconductor layer of a first conductivity type by first forming a dielectric layer on a surface of the semiconductor layer. A polycrystalline support is then formed on the dielectric layer. A lightly doped tub region of a second conductivity type is formed in the semiconductor layer extending to the dielectric layer. The lightly doped tub region is preferably formed by carrying out a conventional diffusion operation, then removing a portion of the thickness of the semiconductor layer which contains the highest dopant concentration. Regions serving as source and drain electrodes of a first and second field effect transistor are then formed in the lightly doped tub region and in the semiconductor layer. Gate electrodes are provided over an insulating layer on the surface of the semiconductor layer to complete fabrication of the complementary devices. The gate electrodes may be formed after the source and drain electrodes, or before them, in a self aligned embodiment.

7 Claims, 11 Drawing Figures

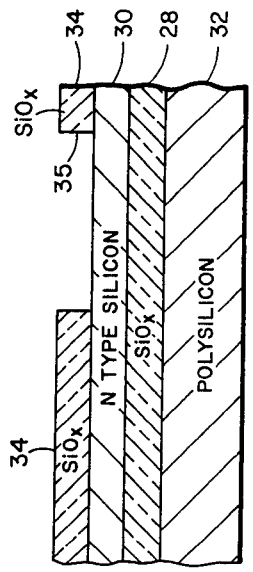
Fig. 3
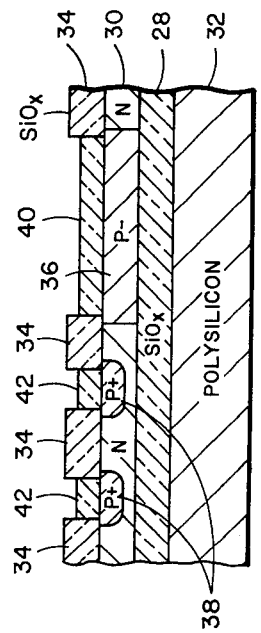
Fig. 4
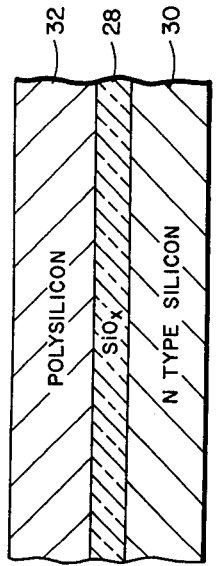
Fig. 5
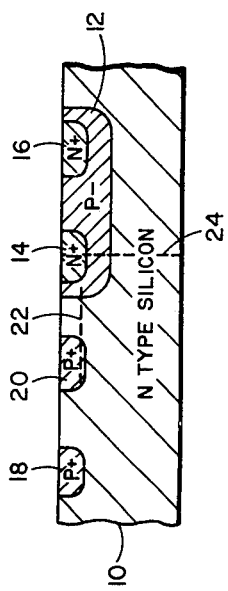
Fig. 1 PRIOR ART
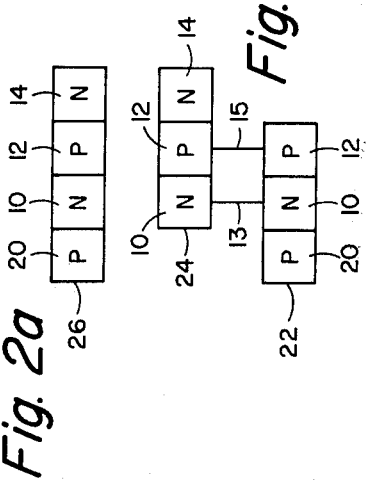
Fig. 2a
Fig. 2b

METHOD OF MAKING ISOLATED COMPLEMENTARY MONOLITHIC INSULATED GATE FIELD EFFECT TRANSISTORS

This is a continuation of application Ser. No. 154,992, filed June 21, 1971, now abandoned.

BACKGROUND

This invention relates to the production of complementary insulated gate field effect transistors, hereinafter called IGFETs, on the same substrate.

It is known to provide a substrate of N-type semiconductive material and to provide a tube or region of P-type semiconductive material in the same semiconductive substrate. Then two separated P+ regions are put in the N substrate outside of the tub to act as a source and drain for a P-type IGFET, the channel being the substrate between the two P+ diffused regions. Furthermore, two separated N+ regions are put into the P− tub to act as source and drain of an N-type IGFET. The tub material between the last-mentioned source and drain forms the channel for the N-type IGFET. In such prior art complementary IGFETs, PN junctions occur between each source and drain and the material in which it is included for each of the two transistors, resulting in four PN junctions, A fifth PN junction is provided between the tub and the substrate. Several bipolar transistors are formed inherently between the various regions of opposite conductivity type. Two of the bipolar transistors in such a construction have elements in common whereby these two bipolar transistors can act as a silicon controlled rectifier, SCR, which can be triggered to prevent proper operation of the IGFETs. Furthermore, the material on each side of each of the several PN junctions are electrodes and the PN junction itself acts as a dielectric whereby several capacitors are inherently produced. The so-produced IGFETs operate slowly since, in the operation thereof, time is required for charging and discharging the several capacitors.

It is an object of this invention to provide complementary IGFETs in the same substrate that are so isolated that there is no danger of latch-up.

It is another object of this invention to provide complementary IGFETs in the same substrate that are faster-operating than presently known such IGFETs.

It is another object of this invention to provide complementary IGFETs on the same substrate that exhibit less capacity than known such IGFETs.

SUMMARY

In accordance with the invention, a thin layer of single crystalline material of one conductivity type is provided overlaying a layer of insulating material. A tube of the other conductivity type is diffused right through the thin layer extending to the insulating layer whereby the bottom of the tub does not form a PN junction with the substrate. The drain and source areas for one transistor are diffused into the tub. The drain and source areas for the complementary transistor are diffused in the thin layer but outside of the tub. As will be shown, one of the bipolar transistors that form a triggerable SCR is prevented from being formed by diffusing the tub through the thin layer, whereby no triggerable SCR is provided. The capacitance of the tub to the remainder of the thin layer is further reduced since the PN junction does not extend under the tub. As another feature of this invention, the several source and drain areas are diffused through the thin layer whereby the PN junctions do not extend under the several source and drain regions, cutting the capacitance down still more. Furthermore, as still another feature of this invention, a self-aligning method is used for providing the sources, drains and gates, which results in the several advantages of the self-aligning method.

DESCRIPTION

Figure 7:
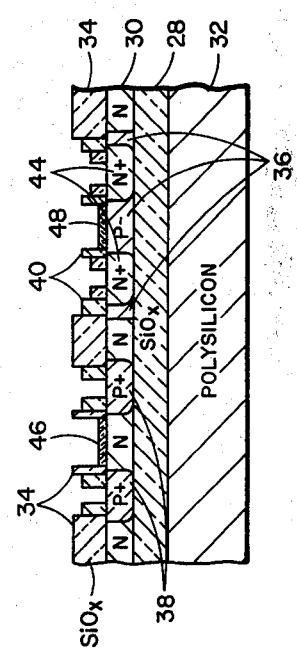
Figure 8:
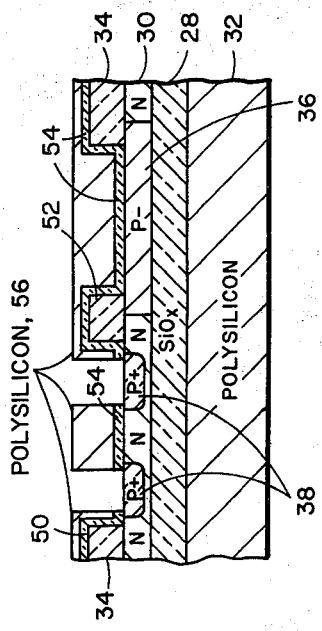
Figure 9:
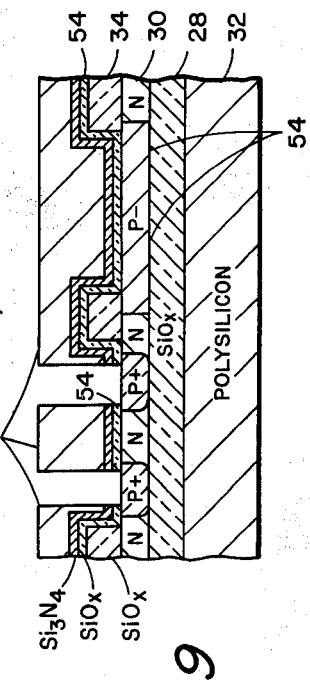
Figure 10:
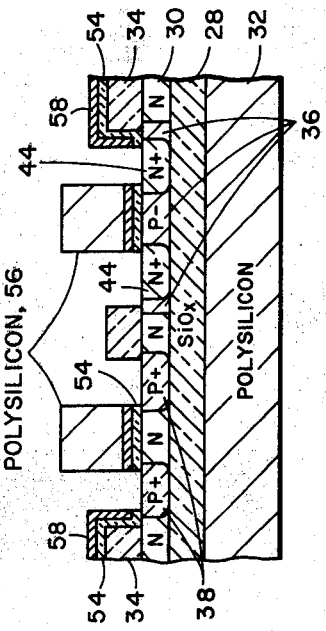

The invention will be better understood upon reading the following description in connection with the accompanying drawing in which, FIG. 1 illustrates a prior art device, FIG. 2a and 2b are diagrams showing various inherent transistors formed by the prior art methods of forming complementary insulated gate field effect transistors which are useful for understanding the advantage of the device of this invention, FIG. 3 illustrates a step of the present invention of providing a mechanically strong thin substrate, FIG. 4 illustrates the step of the present invention of preparing the substrate of FIG. 3 for a diffusion step, FIG. 5 illustrates the step of diffusing a tub and a source and a drain area into the substrate, FIG. 6 illustrates steps of providing low capacitance complementary insulated gate field effect transistors, FIG. 7 illustrates the steps of providing insulated gates to the complementary transistors of FIG. 6, FIG. 8 illustrates steps of providing a self-aligning gate electrode for a P-channel transistor, FIG. 9 illustrates steps of providing a self-aligning gate electrode for an insulated gate field effect transistor in which the sources and drains extend through the substrate and, FIG. 10 illustrates a further step of providing self-aligning gate electrode for complementary insulated gate field effect transistors in which all the sources and drains extend through the substrate.

Turning first to the prior art device of FIG. 1, a substrate 10 which may be of N-type semiconductor material, is provided. A tub 12 of P-type semiconductive material is provided in the upper surface of the substrate 10. N+ regions 14 and 16 in the tub 12 form the source and drain regions of an N-type IGFET. A P-type IGFET is formed by providing the source and drain regions 18 and 20 in the substrate 10 but outside of the tub 12. Therefore, two complementary IGFETs are provided in accordance with the prior art in the substrate 10. However, it will be noticed that each of the regions 18 and 20 forms a PN junction with the substrate 10, each of the regions 14 and 16 forms a PN junction with the tub 12 and the tub 12 and the substrate 10 form a fifth PN junction. As is known, each PN junction acts as a capacitor of which the plates are the semiconductive material on each side of the PN junction. The PN junction itself acts as the dielectric between the plates of the capacitor. The several capacitors have two components, the bottom components comprising the portions of the PN junction under the several regions 12, 14, 16, 18 and 20 and the lateral components comprising the remainder of the several PN junctions which are laterally positioned. It is noted that the bottom component, that is, the PN junction under the region 12 is large in extent as compared to the bottom components of the other PN junctions that comprise the drain and source regions. As is explained below, the capacitance of the several junctions is reduced by avoiding a PN junction under a region 12, 14, 16, 18 and 20 and particularly under the region 12.

It is also noticed that the region 20, the substrate 10 and the region 12 together provide a bipolar PNP transistor as indicated by the horizontally extending dotted line 22. The region 14, the tub 12 and the substrate 10 provides a vertical bipolar NPN transistor as indicated by the vertical line 24. The transistors 22 and 24 are shown diagrammatically in FIG. 2. In FIG. 2, the reference characters 10, 12, 14 and 20 relate the material of the bipolar transistors to the material of FIG. 1. The base of the transistor 22 is the same material as the emitter of the transistors 24. The collector of the transistor 22 and the base of the transistor 24 are the same material. Therefore, the two transistors 22 and 24 are regeneratively coupled as shown by the solid lines 13 and 15, and the four-layer transistor or SCR 26 of FIG. 2 is inherently produced. The vertical transistor 24 has a beta of about 50. The horizontal or lateral transistor 22 has a beta of less than one. Therefore, current flow into the structure of FIG. 1 in the normal operation thereof can turn the resultant SCR 26 on, preventing operation of the device of FIG. 1 as complementary IGFET. More specifically, the device of FIG. 1 is subject to "latch-up". Two coupled lateral transistors are also provided inherently. These lateral transistors include one lateral PNP transistor comprising the source or drain area 20, the substrate 10 and the P$^-$ tub 12. A second lateral NPN transistor comprises the substrate 10, the P$^-$ tub 12 and the drain or source 14. As noted, these lateral transistors have parts in common. However, the betas of these lateral transistors is so low that "latch-up" does not occur.

The method of producing the complementary IGFETs of this invention which have less capacitance and are not subject to latch-up and the complementary IGFETs themselves are explained in connection with FIGS. 3 through 10.

Turning first to FIG. 3, a layer 28 of silicon oxide is put on an N conductivity type single crystal substrate 30. The silicon oxide throughout the several views is represented by the formula $SiO_x$ because the $x$ term is not known exactly. X is a number from 1.7 to 3. Then a substantial thickness of polycrystalline silicon (polysilicon) 32 which has sufficient mechanical strength to act as a support for the device being built is put on the $SiO_x$ layer 28. The thickness of the polysilicon layer 32 is 10 mils, for example. Then as shown in FIG. 4, the device of FIG. 3 is turned over. The monocrystalline silicon 30 is lapped or etched, or a combination of these steps are used, to reduce the thickness thereof to a thickness through which a P-conductivity diffusion may be made. Such a thickness is 8 microns. Then, a $SiO_x$ layer 34 is provided on the substrate 30. A hole 35 is produced in the $SiO_x$ layer 34 where the P-type tub is to be provided as shown in FIG. 4. Then, as shown in FIG. 5, P$^-$ material 36 is diffused all the way through the layer 30. Also, P$^+$ material is diffused into the region 30 and outside of the tub 36 to form the drain and source areas 38, 38. During these diffusions, $SiO_x$ segments 40, 42, 42 grow over the tub 36 and the source and drain 38, 38. It is noted that no junction exists between the bottom of the tub 36 and the region 30. The elimination of this junction reduces the capacitance of the device shown in FIG. 5. Furthermore, since the tub 36 extends through the crystal 30, there is no possibility of the existence of a vertical NPN transistor such as the transistor 24 of FIGS. 1 and 2. Since the existence of the transistor 24 is necessary for a latch-up condition, the elimination of the transistor 24 eliminates the SCR 26 and the possibility of a latch-up condition.

The device thus far shown with reference to FIG. 5, illustrates one embodiment of the C-IGFETs made according to the teaching of the instant invention and are characterized by a tub formed through the active substrate 30 and terminating at a silicon oxide layer 28. The source and drain regions 38 extend only part way through the layer 30. Similar source and drain regions, but of opposite conductivity type, are formed in the tub 36. A further improved embodiment is shown in FIGS. 6 and 7 wherein the sources and drains are diffused all the way to the silicon oxide layer 28.

For low gate threshold voltage value, the concentration of P-type impurities in the tub 36 is low, on the order of $6 \times 10^{15}$ particles per cu. cm. This value of impurity is obtained by a method disclosed in an application by the same inventor entitled "METHOD OF PRODUCING LOW THRESHOLD COMPLEMENTARY INSULATED GATE FIELD EFFECT DEVICES" filed on June 21, 1971, Ser. No. 154,991 and assigned to the assignee of the present application, now U.S. Pat. No. 3,759,763.

In the process of producing the low concentration desired, the crystalline silicon layer 30 is lapped to about 2.5 microns thickness. This thickness is illustrated in FIGS. 6 and 7. With such a thin crystalline layer 30, not only the tub 36 but the drain and source 38, 38 for the P-IGFET and the source and drain 44, 44 for the N-IGFET in the tub 36 extend through the crystalline layer 30, as shown in FIG. 6. The bottom capacitance of the sources and drains 38, 38, 44, 44 is eliminated by this method. The capacitance of the so-formed IGFETs is still further reduced by this diffusing of both the sources and both the drains through the thin crystalline layer 30. Faster operating C-IGFETs are so provided.

FIG. 7 illustrates how the insulated gates are applied to the complementary IGFETs of FIG. 6. Insulated gates are applied to the C-IGFETs of FIG. 5 in a similar manner. For example, the $SiO_x$ coating 34 between the source and drain 38, 38 and the $SiO_x$ coating 40 between the source and drain 44, 44 of FIG. 6 is cut through down to the single crystal layer 30 as shown in FIG. 7. Then a very thin layer 46 of $SiO_x$ is thermally grown over the crystal 30 between the source and drain 38, 38. A very thin layer 48 of $SiO_x$ is similarly grown over the tub 36 between the source and drain 44, 44. Ohmic connections not shown in FIG. 7 are made to the several sources and drains. Gate electrodes not shown in FIG. 7 are applied to the $SiO_x$ layers 46 and 48. The ohmic connections and gate electrodes are applied in a known manner.

The method of applying the gate electrodes of FIG. 7 requires careful alignment of the etching mask used for etching the holes in the $SiO_x$ layers 34 and 40. Misalignment results in an inoperative or very poorly operative product. For making sure that the later applied gate electrode overlies the whole channel between the source and drain, the gate holes are made large, whereby there is a certain amount of overlap of the gate electrode with the source and drain. Due to this overlap, the capacitance between the gate electrode and the source and drains related thereto, called the Miller capacitance, is large. As is known, a Miller capacitance varies with the voltage applied thereacross. A method of automatically aligning the gate electrode with the source and drain, thereby reducing the Miller capacitance, is shown in FIG. 8.

In the device of FIG. 8, the layers 30, 28 and 32 are made as explained above. The tub 36 in the layer 30 and the SiO$_x$ layer 34 are also provided as explained above. Then a hole 50 is provided in the layer 34 over the end part of the crystal 30 where the P-type IGFET is later formed. A hole 52 is provided in the layer 34 over the tub 36 where the N-type IGFET is later formed. Then a very thin layer 54 of high quality SiO$_x$ is thermally grown over the bottoms of the holes 50 and 52. Poly-silicon 56 is provided over the complete surface of the layer 54. Then holes are made through the poly-silicon 56 and the SiO$_x$ 54 in the areas where the P$^+$ source and drain 38, 38 are to be formed. The P$^+$ areas 38, 38 are diffused into the silicon layer 30 through these holes.

The method of providing N$^+$ areas is not illustrated in FIG. 8. N$^+$ areas are provided in the tub 36 by applying a protective coating which covers the source and drain 38, 38 and the overlying gate electrode, to the P-type IGFET and making a pair of separated holes in the polysilicon 56 and the SiO$_x$ layer 54 over the tub 36. The source and drain areas (not shown in FIG. 8) of the N-type IGFET are provided in the same manner as shown with reference to source and drain region 38, 38. The poly-silicon 56 over the N material 30 between the source and drain 38, 38 is P$^+$ doped and is used as the P-IGFET gate electrode. Similarly the poly-silicon 56 over the P$^-$ material between the drain and source (not shown in FIG. 8), see FIG. 10, is N$^+$ doped and is used as the N-IGFET gate electrode.

The drain and source 38, 38 as well as the source and drain in the P-type tub 36 (not shown in FIG. 8) are not deep enough for avoiding the production of the bottom capacitance thereunder. Furthermore, continuous doping to provide drain and source areas that extend through the layer 30 destroys or greatly reduces the proper operation of the IGFET in FIG. 8. This is due to the fact that continued doping causes the diffusing impurities to penetrate through the gate insulation 54, so that the source and drain areas will be joined to each other under the SiO$_x$ layer 54. This joining of source and drain areas destroys the channel under the SiO$_x$ layer 54 between layers 38, 38. Similar channel destructive action takes place when forming deep source and drain areas in the tub 36 of FIG. 8. The method illustrated in FIG. 9 is used to prevent this effect. FIG. 9 differs from FIG. 8 only in that a Si$_3$N$_4$ (silicon nitride) layer 58 is provided before the poly-silicon layer 56 is provided. The method of providing the several drain and source areas is the same in FIGS. 8 and 9. As shown in FIG. 9, the source and drain areas 38, 38 penetrate the silicon layer 30. Penetration results without the source and drains joining because the Si$_3$N$_4$ layer 58 acts as a good diffusion stop, better than the poly-silicon 56 and the SiO$_x$ insulation 54 (of FIG. 8) acting together. Due to the use of a more efficient diffusion stop in FIG. 9, the areas 38, 38 will not penetrate far under the insulation 54 between the source and drain areas 38, 38. When completed, the source and drain 44, 44 in the tub 36, see FIG. 10, will also penetrate the cyrstal 30 without being shorted to each other due to the diffusion stop action of the Si$_3$N$_4$ layer 58.

The method of providing poly-silicon gates of FIGS. 8, 9 and 10 exhibits the four advantages, (1) the gates are self-aligned to the drains and sources since the diffusion for the gates and sources are made in holes that are applied through the poly-silicon gate, (2) since the material of the gate electrode is poly-silicon, and the material of the channel is silicon, the threshold voltage on the gate for current flow in the channel is low, (3) since the gate electrode extends over the drain and source to a lesser extent in the structures of FIGS. 8 and 9 than if a metallic gate electrode where later added as in accordance with FIG. 5, the Miller capacitance, that is the capacitance of the overlap of the gate electrodes and the source and drain is greatly reduced, and (4) the poly-silicon itself is conductive enough not only to act as the gate electrode but extended portions thereof are the connections to the gate electrodes whereby the other connections to the gate electrodes need not later be added.

What is claimed is:

1. A method of making a complementary insulated gate field effect transistor integrated circuit by including the steps of:

forming on a surface of a semiconductor layer of a first conductivity type a dielectric layer;

forming on said dielectric layer a polycrystalline support layer;

forming on an exposed surface of said semiconductor layer a first insulating layer having a first aperture therein;

forming a lightly doped tub region of a second conductivity type through said first aperture and a second insulating layer thereon, said tub region extending through said semiconductor layer to said dielectric layer;

forming first source and drain regions defining a channel of a first field effect transistor in said lightly doped tub region and second source and drain regions defining a channel of a second field effect transistor in said semiconductor layer, said source and drain regions extending to the exposed surface of said semiconductor layer and lightly doped tub region; and forming first and second gate electrodes spaced by a gate insulation layer on the exposed surface of said lightly doped tub region and semiconductor layer from the channels of said first and second field effect transistors, respectively.

2. The method of claim 1 in which the gate electrodes are formed prior to formation of the source and drain electrodes.

3. The method of claim 2 in which the gate insulation layer comprises a composite of silicon oxide and silicon nitride, the gate electrode comprises polycrystalline silicon, and the source and drain electrodes of said first and second field effect transistors extend through said lightly doped tub region and said semiconductor layer, respectively, to said dielectric layer.

4. The method of claim 3 additionally comprising the step of reducing the thickness of said semiconductor layer after forming said polycrystalline support layer.

5. The method of claim 1 in which the gate electrodes are formed after formation of the source and drain electrodes.

6. The method of claim 5 additionally comprising the step of reducing the thickness of said semiconductor layer after forming said polycrystalline support layer and in which the source and drain electrodes of said first and second transistors extend through said lightly doped tub region and said semiconductor layer, respectively.

7. The method of claim 1 in which said lightly doped tub region is formed by diffusing a P-type impurity in said semiconductor layer through the exposed surface, driving in the diffused impurity, and removing a portion of said semiconductor layer from the exposed surface to reduce the thickness of said semiconductor layer.

\* \* \* \* \*